United States Patent [19]

Kodama et al.

[11] Patent Number: 4,535,265

[45] Date of Patent: Aug. 13, 1985

[54] SURFACE ACOUSTIC WAVE TRANSDUCER WITH INTERNAL ACOUSTIC REFLECTION

[75] Inventors: Toshikazu Kodama; Koji Sato, both of Yokohama, Japan

[73] Assignee: Kabushiki Kaisha Toshiba, Kawasaki, Japan

[21] Appl. No.: 611,544

[22] Filed: May 17, 1984

[51] Int. Cl.$^3$ .............................................. H03H 9/25
[52] U.S. Cl. ............................. 310/313 C; 310/313 B; 333/154; 333/195
[58] Field of Search ........... 310/313 B, 313 C, 313 R; 333/151, 154, 194, 195

[56] References Cited

U.S. PATENT DOCUMENTS

| | | | |
|---|---|---|---|
| 3,990,023 | 11/1976 | Kodama | 333/154 |
| 4,007,433 | 2/1977 | Houkawa et al. | 310/313 C |
| 4,160,219 | 7/1979 | Kuny | 333/151 |
| 4,162,465 | 7/1979 | Hunsinger et al. | 333/151 |
| 4,206,380 | 6/1980 | Hazama et al. | 310/313 |
| 4,346,322 | 8/1982 | Sato et al. | 310/313 C |

Primary Examiner—Peter S. Wong
Assistant Examiner—D. L. Rebsch
Attorney, Agent, or Firm—Oblon, Fisher, Spivak, McClelland & Maier

[57] ABSTRACT

A surface acoustic wave transducer comprises a piezoelectric substrate, a first comb-shaped electrode with strips having the same width of $\lambda/8$ ($\lambda$ is the wavelength of a surface acoustic wave), and a second comb-shaped electrode with strips having the same width of $\lambda/8$. The strips of these comb-shaped electrodes are spaced apart from each other for a distance of $\lambda/8$. The strips of either electrode form pairs. Of each pair of strips, one strip has a narrow portion having a width of $\lambda/16$ and the other strip has a broad portion having a width of $3\lambda/16$, which extends along the narrow portion. The narrow and broad portions of the strips of either comb-shaped electrode both acoustically and electrically reflect surface acoustic waves, whereas the other portions of the strips only electrically reflect the waves.

11 Claims, 7 Drawing Figures

SURFACE ACOUSTIC WAVE TRANSDUCER WITH INTERNAL ACOUSTIC REFLECTION

BACKGROUND OF THE INVENTION

The present invention relates to a surface acoustic wave transducer.

A surface acoustic wave transducer comprises a substrate made of piezoelectric material, a first comb-shaped electrode formed on one surface of the substrate, and a second comb-shaped electrode formed on the surface of the substrate. The first and second comb-shaped electrodes have each a plurality of strips. The strips of the first electrode are interdigitated with those of the second electrode.

When a high-frequency signal voltage is applied between the first and second electrodes, the substrate vibrates, thereby generating surface acoustic waves. As the waves propagate along the surface of the substrate, they are reflected from the edges of the strips of both electrodes. The reflected waves form spurious components generally called "acoustic reflection components". In the meantime, the waves propagating under the comb-shaped electrode connected to a prescribed external load will reinduce high-frequency signals on the comb-shaped electrode, thus producing spurious components generally called "electrical reflection components". Both types of reflection components will appear in the output signals of a filter or a delay line composed of the transducer, in the form of a triple transit echo. They deteriorate the characteristic of the filter or delay line.

This problem will be solved if the transducer is so designed as to make the acoustic reflection components cancel out the electrical reflection components over a broad range of frequencies. Several attempts have been made to provide such a surface acoustic wave transducer, but have failed.

SUMMARY OF THE INVENTION

The object of the present invention is to provide a surface acoustic wave transducer with a good spurious characteristic over a broad range of frequencies.

According to the invention, there is provided a surface acoustic wave transducer which comprises: a piezoelectric substrate; a first comb-shaped electrode formed on the piezoelectric substrate, having a plurality of parallel strips extending at right angles to the direction in which surface acoustic waves propagate, each having a first portion which only electrically reflects the waves and a second portion which both electrically and acoustically reflects the waves; and a second comb-shaped electrode formed on the piezoelectric substrate and having a plurality of parallel strips interdigitated with the strips of the first comb-shaped electrode, extending at right angles to the direction in which the waves propagate, each having a first portion which only electrically reflects the waves and a second portion which both electrically and acoustically reflects the waves.

DETAILED DESCRIPTION OF THE PREFERRED EMBODIMENTS

A few embodiments of the invention will be described in detail with reference to the attached drawings.

Figure 1:
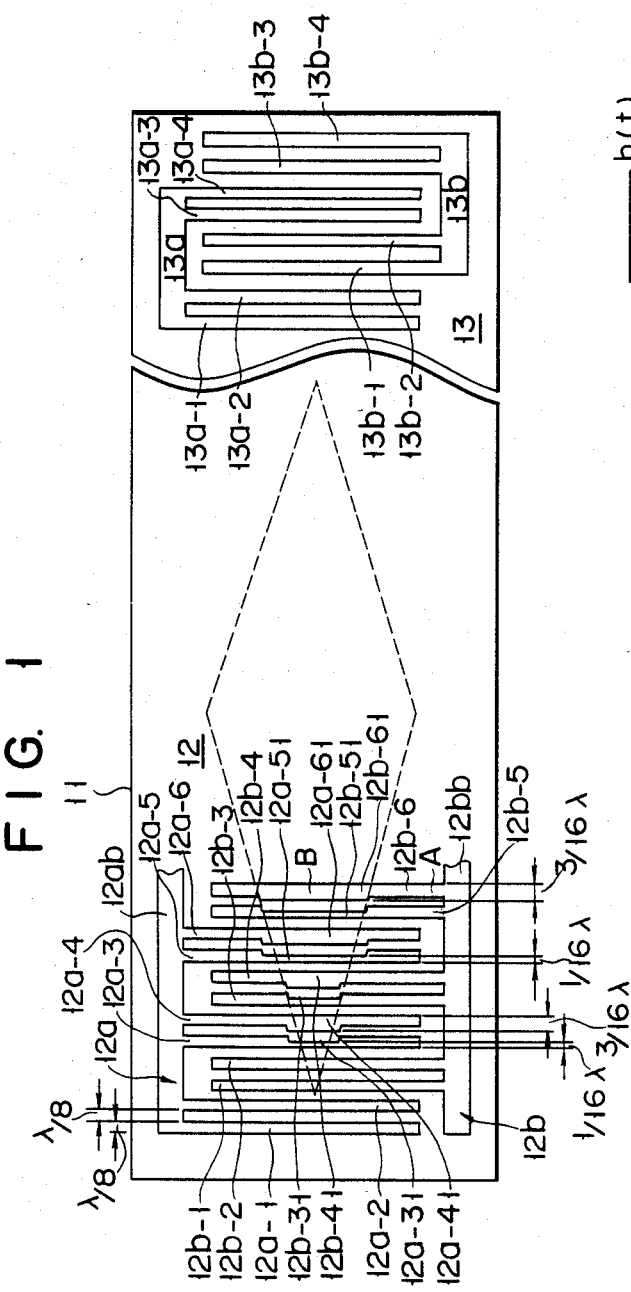
FIG. 1 is a plan view of a surface acoustic wave transducer according to the invention.

FIG. 1 shows a surface acoustic wave transducer as a first embodiment of this invention. The transducer comprises a substrate 11 made of piezoelectric material, e.g., $LiNbO_3$, a first transducer electrode assembly 12, and a second transducer electrode assembly 13. These assemblies 12, 13 are arranged on one surface of substrate 11, and are spaced apart from each other for a predetermined distance.

First transducer electrode assembly 12 comprises a first comb-shaped electrode 12a and a second comb-shaped electrode 12b. Electrode 12a has pairs of parallel strips. The width of these strips is $\lambda/8$, where $\lambda$ is the wavelength of the surface acoustic wave. The strips of any pair are integrally formed with a base strip 12ab and extend at right angles from it. The first and second strips 12a-1, 12a-2 forming a first split electrode pair are spaced for a distance of $\lambda/8$. The third strip 12a-3 is arranged at a distance of $5\lambda/8$ from the second strip 12a-2. The fourth strip 12a-4 is arranged at a distance of $\lambda/8$ from the third strip 12a-3. These strips 12a-3, 12a-4 form a second pair. The middle portion 12a-31 of strip 12a-3 is $\lambda/16$ wide, narrower than both end portions. By contrast, the middle portion 12a-41 of strip 12a-4 is $3\lambda/16$ wide, broader than both end portions. The distance between these portions 12a-31, 12a-41 is $\lambda/8$. The fifth strip 12a-5 is placed at a distance of $5\lambda/8$ from fourth strip 12a-4. The sixth strip 12a-6 is placed at a distance of $\lambda/8$ from fifth strip 12a-5. The strips 12a-5, 12a-6 form a third pair. The middle portion 12a-51 of strip 12a-5 is $\lambda/16$ wide, narrower than both end portions. By contrast, the middle portion 12a-61 of strip 12a-6 is $3\lambda/16$ wide, broader than both end portions. The distance between these portions 12a-31, 12a-41 is $\lambda/8$. Middle portion 12a-51 is longer than the portion 12a-31 of third strip 12-3, and middle portion 12a-61 is also longer than the portion 12a-41 of fourth strip 12a-4. The other pairs of strips (not shown) are similar to the first and third pair in position and shape.

Second electrode 12b is similar in structure to electrode 12a. It comprises a base strip 12bb and pairs of parallel strips which are interdigitated with those of first electrode 12a. The width of these strips is $\lambda/8$. The strips of any pair are integrally formed with base strip 12bb and extend at right angles from it. The strips 12b-1, 12b-2 forming the first pair are spaced for a distance of $\lambda/8$. The third strip 12b-3 is arranged at a distance of $5\lambda/8$ from second strip 12b-2. The fourth strip 12b-4 is arranged at a distance of $\lambda/8$ from strip 12b-3. These strips 12b-3, 12b-4 form the second pair. The middle portion 12b-31 of strip 12b-3 is $\lambda/16$ wide, narrower than both end portions. By contrast, the middle portion 12b-41 of strip 12b-4 is $3\lambda/16$ wide, broader than both end portions. The distance between these portions 12b-31, 12b-41 is $\lambda/8$. The fifth strip 12b-5 is placed at a distance of $5\lambda/8$ from fourth strip 12b-4. The sixth strip 12b-6 is arranged at a distance of $\lambda/8$ from fith strip 12b-5. These strips 12b-5, 12b-6 form the third pair. The middle portion 12b-51 of strip 12b-5 is λ/16 wide, narrower than both end portions. By contrast, the middle portion 12b-61 of strip 12b-6 is 3λ/16 wide, broader than both end portions. The distance between these portions 12b-31, 12b-41 is λ/8. Middle portion 12b-51 is longer than the portion 12b-31 of third strip 12b-3, and middle portion 12b-61 is also longer than the portion 12b-41 of fourth strip 12a-4. The other pairs of strips (not shown) are similar to the first and third pair in position and shape.

All the strips 12a-1, 12a-2, 12a-3 ... of first electrode 12a are of the same length and extend from base strip 12ab to the position close to the base strip 12bb. Similarly, all the strips 12b-1, 12b-2, 12b-3 ... of second electrode 12b extend from base strip 12bb to the positions near the base strip 12ab. Hence, those portions of the strips of electrode 12a, which extend along the corresponding portions of the adjacent strips of electrode 12b, have the same length, i.e., interdigitated length.

Second transducer electrode assembly 13 comprises a first comb-shaped electrode 13a and a second comb-shaped electrode 13b. Electrode 13a has parallel strips 13a-1, 13a-2, 13a-3 and 13a-4, and electrode 13b also has parallel strips 13b-1, 13b-2, 13b-3 and 13b-4. The strips of both electrodes 13a, 13b have the same width λ/8 and have the same length. Strips 13a-1 and 13a-2 are interdigitated with strips 13b-1 and 13b-2.

Figure 2:
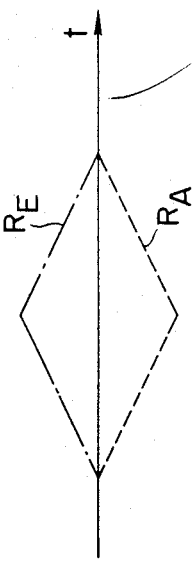
FIG. 2 illustrates the response characteristics of the transducer of FIG. 1 with respect to electric and acoustic reflection impulses (i.e., spurious components)

With reference to FIG. 2, it will now be described how the transducer of FIG. 1 operates. Let us assume that the comb-shaped electrodes 12a, 12b are connected between the output terminals of a high-frequency wave signal load (not shown). The substrate 11 is excited by an output signal from the incoming wave and regenerates surface acoustic waves. Since the strips of both electrodes 12a and 12b have the same width of λ/8 and are spaced apart from each other for a distance of λ/8, except for the portions which are surrounded by the diamond-shaped envelope, those portions A of the strips which are outside the envelope produce no acoustic reflection components for the reason disclosed in U.S. Pat. No. 3,727,155. Since those portions B of the strips which are surrounded by the envelope have widths less than λ/8 or more than λ/8, the impulse response characteristic RA with respect to the acoustic reflection component changes with time as illustrated by a broken line in FIG. 2.

Figure 3:
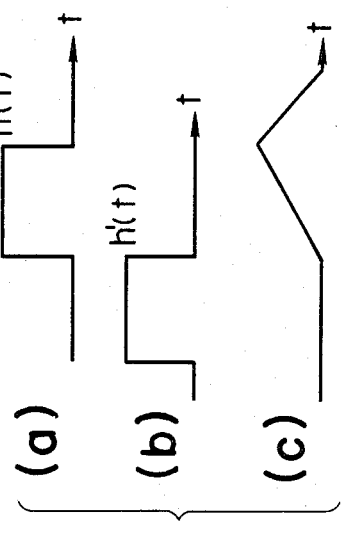
FIG. 3 shows the response characteristics of the transducer of FIG. 1 with respect to electrical reflection impulses (i.e., spurious components)

Although the surface acoustic waves are not reflected from portions A, electrical reflection components will be induced in these portions A by secondary signals generated when portions A are excited by the surface acoustic waves propagating under the electrodes 12a, 12b. The portions B of the strips generate not only the acoustic reflection components but electrical reflection components. The impulse response characteristic RE with respect to the electrical reflection components generated by the portions A and B of the strips changes with time as indicated by a chain line in FIG. 2. As clearly understood from FIG. 2, the characteristic RE is defined by superposing the signal voltages regenerated by the strips as portions A and B are excited by the surface acoustic waves. In short, this characteristic RE is the self-convolution of the interdigitated pattern of the strips of electrodes 12a and 12b. As shown in FIG. 1, the strips of electrodes 12a and 12b have the same interdigitated length. The interdigitated pattern h(t) of these strips is shown in FIG. 3(a). The self-convolution of pattern h(t) is obtained by the superposing integral of the pattern h(t) with another identical pattern h'(t) shown in FIG. 3(b) and by plotting the union of both patterns h(t) and h'(t) on the time axis. The self-convolution thus obtained is shown in FIG. 3(c). Accordingly, the characteristic RE changes to the same extent as the characteristic RA but in the opposite direction.

Since the reason why the response RE is in opposite direction with respect to the response RA is, for example, shown by Kentaro Hanma et al, "A Tripple Transit Suppression Technique", 76IEEE Ultrasonics Symp. Proc. P-328, the more detailed explanation can be omitted here.

If the interdigitated pattern of portions B is designed in such a manner as to make the response RA cancel out the response RE, the transducer will have good spurious characteristics over a broad range of frequency, and will not be influenced by acoustic reflection or electrical reflection.

The transducer electrode assembly 12 shown in FIG. 1 has the reflection impulse response characteristic illustrated in FIG. 2. Therefore, the surface acoustic waves reemitted from assembly 12 to assembly 13 have the two types of reflection spurious components (FIG. 2). It should be noted that the acoustic reflection components cancel out the electrical reflection components in the transducer electrode assembly 13.

Figure 4:
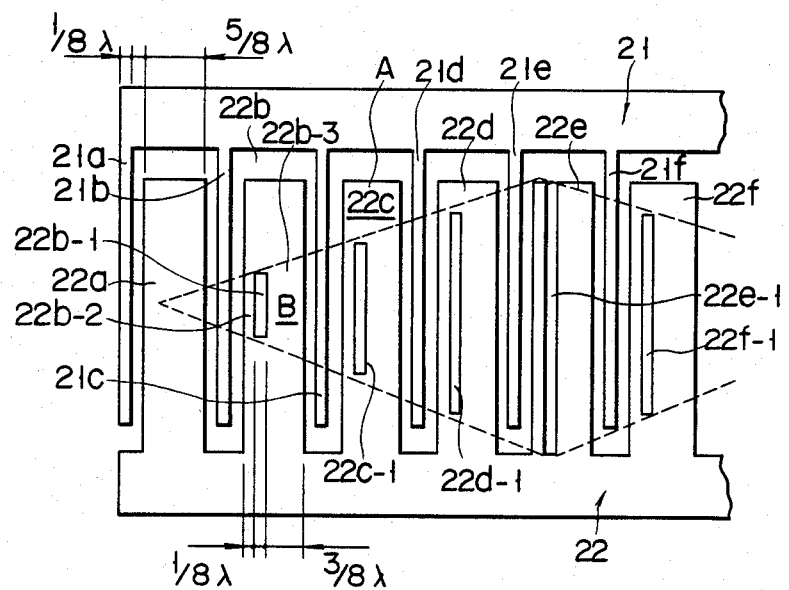
FIGS. 4-7 are plan views of other embodiments of the present invention.

FIG. 4 illustrates another surface acoustic wave transducer, a second embodiment of the invention. This transducer comprises a first comb-shaped electrode 21 and a second comb-shaped electrode 22. Electrode 21 has parallel strips 21a, 21b, 21c... which have the same width of λ/8. Electrode 22 has parallel strips 22a, 22b, 22c... which have the same width of 5λ/8. The strips of electrode 21 are interdigitated with those of electrode 22. The strips of electrodes 21, 22 are spaced apart from each other for a distance of λ/8. The strips 22b, 22c, 22d, 22e... have each a slit having a width of λ/8. The slits of these strips have such different lengths that the acoustic reflection components may have the diamond-shaped envelope shown by broken lines in FIG. 4.

Those portions A of the strips 21a, 21b... and 22a, 22b..., which are located outside the envelope, produce electrial reflection components, but no acoustic reflection components. By contrast, those portions B of strips 21a, 21b... and 22a, 22b..., which are enclosed by the envelope, produce both electrical and acoustic reflection components.

Strips 21a, 21b... having a width of λ/8 and the strips 22a, 22b... having a width of 5λ/8, which are arranged with gaps of λ/8 among them, produce no acoustic reflection components for the known reason which is stated in U.S. Pat. No. 3,990,023.

As in the embodiment of FIG. 1, the interdigitated lengths of strips 21a, 21b... and 22a, 22b... are the same. That is, those portions of the strips of electrode 21, which extend along the corresponding portions of the adjacent strips of electrode 22, have the same length.

Owing to the convolution of its interdigitated pattern, the transducer of FIG. 4 has the impulse response characteristic RE with respect to the electrical reflection components, which is identical with that shown in FIG. 2. The impulse response characteristic RA with respect to acoustic reflection components produced by the portions B of strips 21a, 21b... and 22a, 22b... is also identical with that of FIG. 2. Hence, the second embodiment (FIG. 4) has the same spurious response characteristic as shown in FIG. 2.

Figure 5:
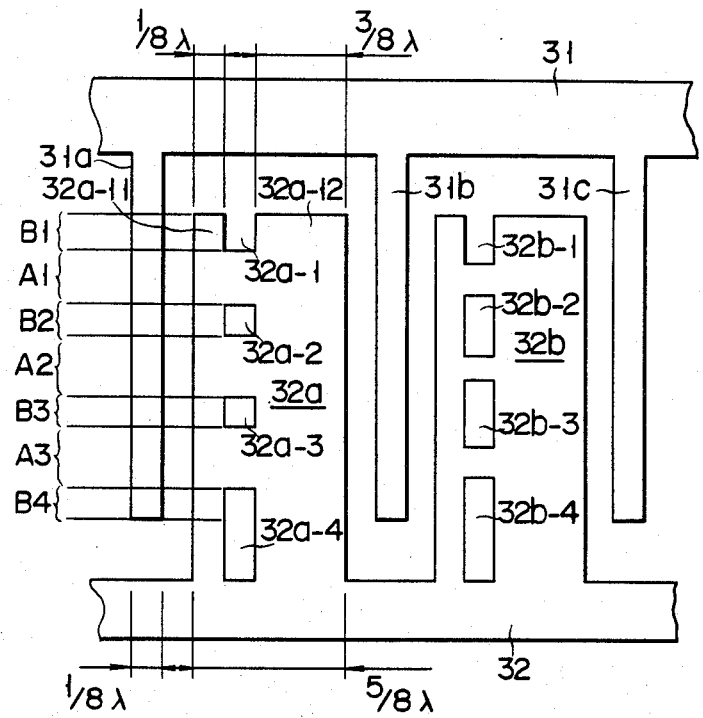

FIG. 5 illustrates another surface acoustic wave transducer, a third embodiment of the invention. This transducer comprises a first comb-shaped electrode 31 and a second comb-shaped electrode 32. Electrode 31 has parallel strips 31a, 31b, 31c . . . which have the same width of $\lambda/8$. Electrode 32 has parallel strips 32a, 32b . . . which have the same width of $5\lambda/8$. The strips of electrode 31 are interdigitated with those of electrode 32. The strips of electrodes 31, 32 are spaced apart from each other for a distance of $\lambda/8$. The strips 32a, 32b . . . have each four slits having a width of $\lambda/8$. More specifically, strip 32a has slits 32a-1, 32a-2, 32a-3, and 32a-4 vertically aligned (FIG. 5); strip 32b has slits 32b-1, 32b-2, 32b-3 and 32b-4 also vertically aligned (FIG. 5), and so forth.

In the strip 32a, slits 32a-1 to 32a-4 define an electrode 32a-11 having a width of $\lambda/8$ and another electrode 32a-12 having a width of $3\lambda/8$. Those portions B1 of electrodes 32a-11 and 32a-12, which are horizontally aligned with slit 32a-1 (FIG. 5), produce both acoustic and electrical reflection components. That portion A1 of strip 32a, where no slit is formed, generates no acoustic reflection components. Those portions B2, B3 and B4 of electrodes 32a-11 and 32a-12, which are horizontally aligned with slits 32a-2, 32a-3 and 32a-4 (FIG. 5), produce both acoustic and electrical reflection components. Those portions A2 and A3 of electrodes 32a, which are positioned among the portions B2, B3 and B4, generate no acoustic reflection components. Of that portion of strip 32b which extends along strip 31a, the total length of slits 32a-1 to 32a-4 corresponds to the length of the slit 22b-1 of strip 22b shown in FIG. 4.

Similarly, in the strip 32b, slits 32b-1 to 32b-4 define an electrode 32b-11 having a width of $\lambda/8$ and another electrode 32b-12 having a width of $3\lambda/8$. The features of the strip 32b are similar to those of strip 32a. The total length of slits 32b-1 to 32b-4 is longer than that of the slits 32a-1 to 32a-4 of strip 32a. The ratio of the former to the latter is equal to the ratio of the length of slit 22b-1 (FIG. 4) to the length of slit 22c-1 (FIG. 4).

The transducer of FIG. 5, in which the portions A1–A3 and B1–B4 are aligned along a line at right angles to the direction in which surface acoustic waves propagate, achieve an effect that an amplitude of the response RA in the electrode-interdigitating direction can be made to have effectively a uniform value. As a result, it is also possible to have an effect of mutual cancellation of the responses RA and RE in the SAW beam width direction, thus increasing a tolerance of selecting a type of interdigital transducer which is used in combination with the transducer of this invention when it is desired to form a filter.

In the first and second embodiments shown in FIGS. 1 and 4, respectively, the envelope of the region B is shaped like a diamond. Instead, the interdigitated pattern may be so designed that the envelope may change along a curve, not a straight line, so that various secondary effects can be compensated for.

In all the embodiments described above, the strips of either comb-shaped electrode have the same length, and the strips of both comb-shaped electrodes are interdigitated for the same distance. This invention is not limited to these embodiments. It may be applied to a surface acoustic wave transducer, where the interdigitated length varies in the direction of wave propagation.

Figure 6:
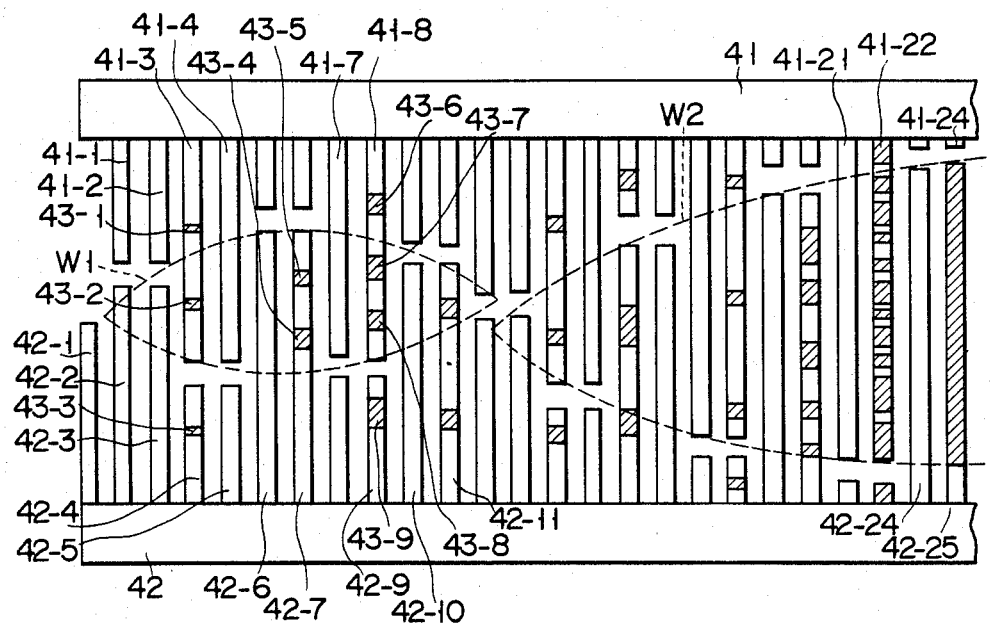

FIG. 6 shows a fourth embodiment of the invention, a surface acoustic wave transducer in which the interdigitated length changes in the direction of wave propagation. This transducer comprises two comb-shaped electrodes 41 and 42. Electrode 41 has strips 41-1, 41-2, 41-3 . . . having the same width of $\lambda/8$. Electrode 42 also has strips 42-1, 42-2, 42-3 . . . having the same width of $\lambda/8$. Strips 41-3, 41-4, 41-7, 41-8 . . . are interdigitated with strips 42-3, 42-6, 42-7, 42-10 . . . , so that the surface acoustic wave may have such an envelope as indicated by curves W1 (FIG. 6) Similarly, the other specified strips of electrode 41 are interdigitated with the other specified strips of electrode 42 so that the surface acoustic wave may have such an envelope as represented by curves W2.

One or more metal layers such as chromium layers are formed on some of the strips of the transducer (FIG. 6) which are mutually interdigitated. More precisely, two chromium layers 43-1 and 43-2 are formed on strip 41-3; one chromium layer 43-3 is placed on strip 42-4; two chromium layers 43-4 and 43-5 are laid on strip 42-7; three chromium layers 43-6, 43-7 and 43-8 are arranged on strip 41-8 at predetermined intervals; and one chromium layer 43-9 is formed on strip 42-9.

In the transducer of FIG. 6, all the strips have the same width of $\lambda/8$ and are spaced apart from each other for a distance of $\lambda/8$. Hence they produce no acoustic reflection components, except for those portions on which the chromium strips 43-1, 43-2, 43-3 . . . are formed. Hence, these portions both acoustically and electrically reflect surface acoustic waves. The number of chromium strips formed on each strip varies with the direction of wave propagation. The transducer of FIG. 6 can attain the same effects as those of the embodiments shown in FIGS. 1 and 4.

As stated earlier, in the embodiment of FIG. 1, the surface acoustic waves emitted from the assembly 12 to the assembly 13 contain acoustic and electrical reflection components (FIG. 2). The acoustic reflection components cancel out the electrical reflection components in the transducer electrode assembly 13. For this reason, two or more assemblies 12 cannot be used to achieve better transmission and reception of surface acoustic waves. This problem is solved by the embodiment of FIG. 5.

Figure 7:
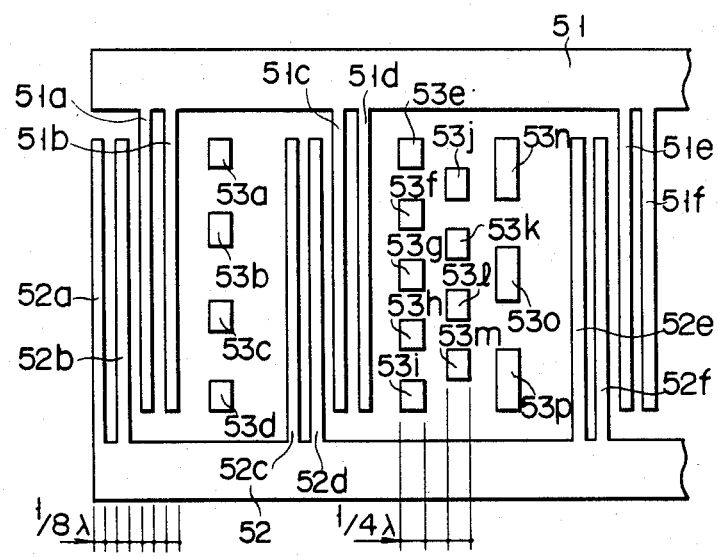

This problem is also solved by another embodiment of the invention, which is illustrated in FIG. 7. The surface acoustic wave transducer of FIG. 7 comprises two comb-shaped electrodes 51 and 52. Electrode 51 has strips 51a, 51b, 51c . . . having the same width of $\lambda/8$. Similarly, electrode 52 has strips 52a, 52b, 52c . . . having the same width of $\lambda/8$. The strips of both electrodes 51 and 52 only electrically reflect surface acoustic waves; they do not acoustically reflect the waves. The strips of electrode 51 are interdigitated with those of electrode 52 in the fashion shown in FIG. 7. Between strips 51b and 52c, four reflecting or floating electrodes 53a, 53b, 53c and 53d having the same width of $\lambda/8$ are aligned along a line at right angles to the direction of wave propagation. The floating electrodes are usually provided at a position shifted by $\lambda/8$ from the center of the split electrodes 51b and 51c. Further, between strips 51d and 52e, three columns of reflecting electrodes are arranged. The first column is comprised of five reflecting electrodes 53e–53i; the second column consists of four reflecting electrodes 53j–53m; and the third column is made up of three reflecting strips 53n, 53o and 53p. The reflecting electrodes 53e–53p have the same width of λ/4.

The reflecting strips 53a–53d reflect the surface acoustic waves reaching them. Other waves pass through the gaps between strips 53a–53d. Since the strips 53a to 53d are distributed in the width direction, the reflection component due to the response RA is made to have a similar amplitude in the interdigital direction and is undergone by the diffraction of the passed waves. Therefore, cancellation of the responses RA and RE can also be realized in the beam width direction. After all, the surface acoustic waves propagating from this transducer contain no spurious components. Two or more transducer electrode assemblies of the type shown in FIG. 7 may be arranged on a piezoelectric substrate, thereby forming a surface acoustic wave transducer of a high efficiency.

What is claimed is:

1. A surface acoustic wave transducer comprising:
   a piezoelectric substrate;
   a first comb-shaped electrode formed on one surface of the piezoelectric substrate and having a plurality of parallel strips extending at right angles to the direction in which surface acoustic waves propagate; and
   a second comb-shaped electrode formed on the piezoelectric substrate and having a plurality of parallel strips interdigitated with the strips of said first comb-shaped electrode, extending at right angles to the direction in which the waves propagate;
   the parallel strips provided in at least one of said first and second comb-shaped electrodes having each a first portion which corresponds to said first portion and which only electrically reflects the waves and a second portion which both electrically and acoustically reflects the waves, and an effective length of said second portion being weighted in a propagation direction of a surface acoustic wave in a predetermined fashion.

2. A surface acoustic wave transducer comprising:
   a piezoelectric substrate;
   a first comb-shaped electrode formed on one surface of the piezoelectric substrate and having a plurality of parallel strips extending at right angles to the direction in which surface acoustic waves propagate; and
   a second comb-shaped electrode formed on the piezoelectric substrate and having a plurality of parallel strips interdigitated with the strips of said first comb-shaped electrode, extending at right angles to the direction in which the waves propagate;
   the parallel strips provided in at least one of said first and second comb-shaped electrodes having each a first portion which only electrically reflects the waves and a second portion which corresponds to said first portion and which both electrically and acoustically reflects the waves, and an envelope of an effective length of said second portion being substantially a self-convolution of an envelope of an overlap region of said interdigitated parallel strips of said first and second comb-shaped electrodes.

3. A surface acoustic wave transducer comprising:
   a piezoelectric substrate;
   a first comb-shaped electrode formed on one surface of the piezoelectric substrate and having a plurality of parallel strips extending at right angles to the direction in which surface acoustic waves propagate; and
   a second comb-shaped electrode formed on the piezoelectric substrate and having a plurality of parallel strips interdigitated with the strips of said first comb-shaped electrode in a predetermined overlap length weighting fashion for forming therein an overlap region and non-overlap region, extending at right angles to the direction in which the waves propagate;
   the parallel strips provided in at least one of said first and second comb-shaped electrodes having each a first portion which only electrically reflects the waves and a second portion which corresponds to said first portion and which both electrically and acoustically reflects the waves, and an envelope of an effective length of said second portion being substantially a self-convolution of an envelope of an overlap region of said interdigitated parallel strips of said first and second comb-shaped electrodes.

4. A surface acoustic wave transducer according to claim 2 or 3, wherein the first and second portions are provided in said first and second comb-shaped electrodes and the second portions of the strips of said first comb-shaped electrode are interdigitated with the second portions of the strips of said second comb-shaped electrode in such a manner that a width of the interdigitated electrodes vary with a predetermined envelope.

5. A surface acoustic wave transducer according to claim 4, wherein said first portions have the same width of λ/8, where λ is the wavelength of the surface acoustic waves, and are spaced apart from each other for a distance of λ/8, and each of said second portions is that portion of a strip which is about λ/16 wide, narrower than the end portions, or 3λ/16 wide, broader than the end portions.

6. A surface acoustic wave transducer according to claim 4, wherein said first portions include:
   (a) those portions of the strips of said first comb-shaped electrode which are located outside said diamond-shaped envelope and have the same width of about λ/8, and
   (b) those portions of the strips of said second comb-shaped electrode which are located outside said diamond-shaped envelope and have the same width of about 5λ/8; and said second portions include:
   (c) the other portions of said first comb-shaped electrode which are located inside said diamond-shaped envelope and have the same width of about λ/8, and
   (d) those portions of the strips of said second comb-shaped electrode which are located inside said diamond-shaped envelope and have the same width of about 5λ/8, each of these portions having a slit which extends over the entire length of the portion at right angles to the direction of propagation of the waves, and defines a strip having a width of about λ/8 and another strip having a width of about 3λ/8.

7. A surface acoustic wave transducer according to claim 4, wherein said first portions include:
   (a) those portions of the strips of said first comb-shaped electrode which have the same width of about λ/8, and
   (b) those portions of the strips of said second comb-shaped electrode which have the same width of about 5λ/8; and said second portions include:

(c) the other portions of said first comb-shaped electrode which have the same width of about λ/8, and
(d) those portions of the strips of said second comb-shaped electrode which have the same width of about 5λ/8 and have each a plurality of slits having the same width of λ/8, being aligned and spaced apart for a predetermined distance along a straight line at right angles to the direction of propagation of the waves, and defining a strip having a width of about λ/8 and another strip having a width of about 3λ/8.

8. A surface acoustic wave transducer according to claim 4, wherein said first portions include:
(a) those portions of the strips of said first comb-shaped electrode which have the same width of about λ/8, and
(b) those portions of the strips of said second comb-shaped electrode which have the same width of about λ/8; and said second portions include:
(c) the other portions of said first comb-shaped electrode which have the same width of about λ/8 and each a plurality of wave-reflecting strips formed at predetermined positions, and
(d) those portions of the strips of said second comb-shaped electrode which have the same width of about λ/8 and have each a plurality of wave-reflecting strips formed at predetermined positions.

9. A surface acoustic wave transducer according to claim 8, wherein each strip of said first comb-shaped electrode is interdigitated with the adjacent strip of said second comb-shaped electrode for a distance determined by a specially weighted interdigitated pattern.

10. A surface acoustic wave transducer according to claim 8, wherein said wave-reflecting strips are made of chromium.

11. A surface acoustic wave transducer according to claim 4, wherein said first portions are the strips of said first and second comb-shaped electrodes, which have the same width of about λ/8 and are spaced apart from each other for a distance of λ/8; and said second portions are a plurality of wave-reflecting strips electrically isolated from said first and second comb-shaped electrodes and arranged in columns extending at right angles to the direction of propagation of the surface acoustic waves.

* * * * *